(12) United States Patent
Chang et al.

(10) Patent No.: US 10,504,728 B2
(45) Date of Patent: Dec. 10, 2019

(54) MANUFACTURING METHOD OF SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventors: Rongyao Chang, Shanghai (CN); Yang Song, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 15/706,069

(22) Filed: Sep. 15, 2017

(65) Prior Publication Data
US 2018/0122636 A1    May 3, 2018

(30) Foreign Application Priority Data

Oct. 31, 2016   (CN) .......................... 2016 1 0927405

(51) Int. Cl.
*H01L 21/033*   (2006.01)
*H01L 21/02*   (2006.01)
(Continued)

(52) U.S. Cl.
CPC .... *H01L 21/0337* (2013.01); *H01L 21/02057* (2013.01); *H01L 21/02063* (2013.01);
(Continued)

(58) Field of Classification Search
CPC .............. H01L 21/0337; H01L 21/306; H01L 21/02057; H01L 21/3105; H01L 21/02063; H01L 21/0332; H01L 21/02071
See application file for complete search history.

(56) References Cited

U.S. PATENT DOCUMENTS

| 5,484,749 A * | 1/1996 | Maeda | ................. C23C 16/401 |
| | | | 257/E21.275 |
| 2002/0097295 A1* | 7/2002 | Toda | ......................... B41J 2/16 |
| | | | 347/45 |

(Continued)

FOREIGN PATENT DOCUMENTS

KR   1020160083574   *   1/2016   ............. H01L 45/00

OTHER PUBLICATIONS

European Search Report for corresponding European Application No. 17198885.0 dated Mar. 14, 2018 (8 pages).
(Continued)

*Primary Examiner* — Kyoung Lee
*Assistant Examiner* — Christina A Sylvia
(74) *Attorney, Agent, or Firm* — Brinks Gilson & Lione

(57) ABSTRACT

The present disclosure is directed to a manufacturing method of a semiconductor device. The manufacturing method includes: providing an initial structure including a to-be-etched material layer and a mask structure located on the to-be-etched material layer, the mask structure including a hydrophilic first mask layer; patterning the mask structure to form a patterned mask structure; etching the to-be-etched material layer by using the patterned mask structure as a mask; performing hydrophobic processing on the first mask layer; and performing cleaning processing. The manufacturing method according to the present disclosure helps to prevent the first mask layer from being adhered or combined (Continued)

during the cleaning processing, thereby resolving the problem that a linear structure collapses.

10 Claims, 8 Drawing Sheets

(51) Int. Cl.
*H01L 21/306* (2006.01)
*H01L 21/3105* (2006.01)

(52) U.S. Cl.
CPC .... *H01L 21/02071* (2013.01); *H01L 21/0332* (2013.01); *H01L 21/306* (2013.01); *H01L 21/3105* (2013.01)

(56) References Cited

U.S. PATENT DOCUMENTS

2004/0013858 A1* 1/2004 Hacker ............ H01L 21/02063
428/195.1
2006/0281266 A1 12/2006 Wells
2009/0311868 A1* 12/2009 Hayashi ............ H01L 21/02057
438/706

OTHER PUBLICATIONS

Matsumoto et al., *The property of plasma-polymerized fluorocarbon film in relation to CH4/C4F8 ratio and substrate temperature*; Sensors and Actuators 83:1-3, (May 2000) pp. 179-185.

* cited by examiner

MANUFACTURING METHOD OF SEMICONDUCTOR DEVICE

CROSS-REFERENCE TO RELATED APPLICATION

This application is based on and claims priority to Chinese patent Application CN 201610927405.9, filed Oct. 31, 2016, the entire content of which is incorporated herein by reference.

BACKGROUND

Technical Field

The present disclosure relates to the technical field of semiconductors, and in particular to a manufacturing method of a semiconductor device.

Related Art

At present, a trench having a high aspect ratio is widely applied in the field of manufacturing semiconductors. During a process of etching the trench having a high aspect ratio, sometimes it may occur that a linear structure collapses after a wet cleaning process is performed. The linear structure herein may include a semiconductor fin, a Shallow Trench Isolation (STI) having a relatively high aspect ratio, or a metal connection line.

SUMMARY

The inventor of the present disclosure finds that $SiO_2$ is hydrophilic. Therefore, during a wet cleaning process, a patterned $SiO_2$ residual on a linear structure causes adhesion or combination easily, so that collapse of the linear structure easily occurs.

The inventor of the present disclosure finds the problems in the foregoing prior art, and provides a new technical solution regarding at least one of the problems.

In one aspect of the present disclosure, a manufacturing method of a semiconductor device is provided. The method includes: providing an initial structure including a to-be-etched material layer and a mask structure located on the to-be-etched material layer, the mask structure including a hydrophilic first mask layer; patterning the mask structure to form a patterned mask structure; etching the to-be-etched material layer by using the patterned mask structure as a mask; performing a hydrophobic processing on the first mask layer; and performing a cleaning processing.

In some forms, the hydrophobic processing includes a plasma processing; and gases used in the plasma processing include He and an alkane gas, or include N2, H2, or Ar.

In some forms, the alkane gas includes methane; He and methane are used as the gases used in the plasma processing, and the plasma processing is performed for a processing time of 6 seconds to 5 minutes within a pressure range of 10 millitorr to 200 millitorr and within a temperature range of 0° C. to 150° C.

In some forms, a material for the first mask layer includes a silicon dioxide.

In some forms, the initial structure further includes a buffer layer located between the to-be-etched material layer and the mask structure; and in the step of etching the to-be-etched material layer, the buffer layer is also etched.

In some forms, the mask structure further includes a hard mask layer on the buffer layer, the first mask layer being located on the hard mask layer; and the mask structure further includes a second mask layer on the first mask layer.

In some forms, the hard mask layer includes a polysilicon layer and/or a silicon nitride layer.

In some forms, the mask structure is patterned by using photolithography and etching processes.

In some forms, the first mask layer is on the to-be-etched material layer; and the mask structure further includes: a bottom anti-reflective coating layer (BARC layer) on the first mask layer, and a patterned second mask layer on the BARC layer.

In some forms, the step of patterning the mask structure includes: etching the BARC layer by using the patterned second mask layer as a mask, so as to form a patterned BARC layer; depositing a third mask layer to cover the patterned second mask layer and the patterned BARC layer; etching the third mask layer, and removing the second mask layer and the BARC layer, so as to form a patterned third mask layer; and etching the first mask layer by using the patterned third mask layer as a mask, so as to form the patterned mask structure.

In some forms, the first mask layer is on the to-be-etched material layer; and the mask structure further includes: a first hard mask layer located on the first mask layer, a second hard mask layer located on the first hard mask layer, a BARC layer located on the second hard mask layer, and a patterned second mask layer located on the BARC layer.

In some forms, the step of patterning the mask structure includes: etching the BARC layer and the second hard mask layer by using the patterned second mask layer as a mask, so as to form a patterned BARC layer and a patterned second hard mask layer; removing the BARC layer and the second mask layer; depositing a third mask layer to cover the patterned second hard mask layer; etching the third mask layer and removing the second hard mask layer to form a patterned third mask layer; etching the first hard mask layer by using the patterned third mask layer as a mask, so as to form a patterned first hard mask layer; removing the third mask layer; depositing a fourth mask layer to cover the patterned first hard mask layer; etching the fourth mask layer and removing the first hard mask layer to form a patterned fourth mask layer; and etching the first mask layer by using the patterned fourth mask layer as a mask, so as to form the patterned mask structure.

The manufacturing method according to the present disclosure helps to prevent the first mask layer from being adhered or combined during the cleaning processing, thereby resolving the problem that a linear structure collapses.

Other features and advantages of the present disclosure will become clearer in the following detailed description of the exemplary forms of the present disclosure with reference to the accompanying drawings.

BRIEF DESCRIPTION OF THE DRAWINGS

The accompanying drawings that form a part of the specification describe the forms of the present disclosure, and are used to explain the principles of the present disclosure together with the specification.

With reference to the accompanying drawings, the present disclosure can be understood more clearly according to the following detailed description, where.

DETAILED DESCRIPTION

Figure 1:
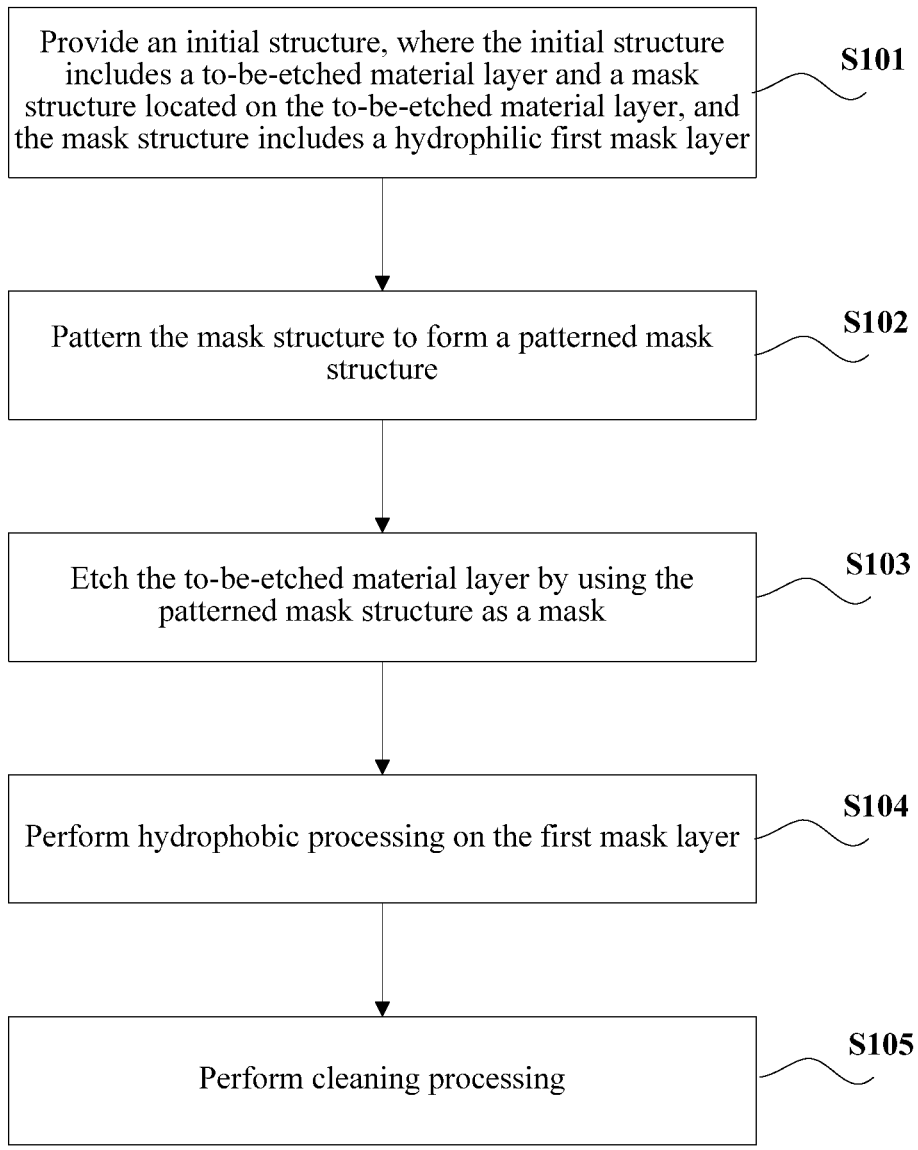
FIG. 1 is a flowchart of a manufacturing method of a semiconductor device.

Various exemplary forms or implementations of the present disclosure are described in detail with reference to the accompanying drawings. It should be noted that: unless being otherwise described, relative layouts, mathematical expressions, and numeric values of components and steps described in these forms do not limit the scope of the present disclosure.

Meanwhile, it should be noted that for ease of description, sizes of the parts shown in the accompanying drawings are not drawn according to an actual proportional relationship.

The following description about the exemplary forms are only illustrative, and should not be used as any limitation on the present disclosure and applications or uses of the present disclosure.

Technologies, methods, and devices that are known by a person of ordinary skill in the art may not be discussed in detail. However, if appropriate, the technologies, methods, and devices should be considered as a part of the description.

In all examples shown and discussed herein, any specific value should be interpreted to be illustrative only rather than a limitation. Therefore, other examples of the exemplary forms may have different values.

It should be noted that: similar reference numerals, labels and letters represent similar items in the following accompanying drawings. Therefore, once an item is defined in a figure, the item may be but needs not to be further discussed in subsequent figures.

The inventor of the present disclosure finds that $SiO_2$ is hydrophilic. Therefore, during a wet cleaning process, a patterned $SiO_2$ residual on a linear structure causes adhesion or combination easily, so as to cause the linear structure to collapse easily.

Figure 2A:
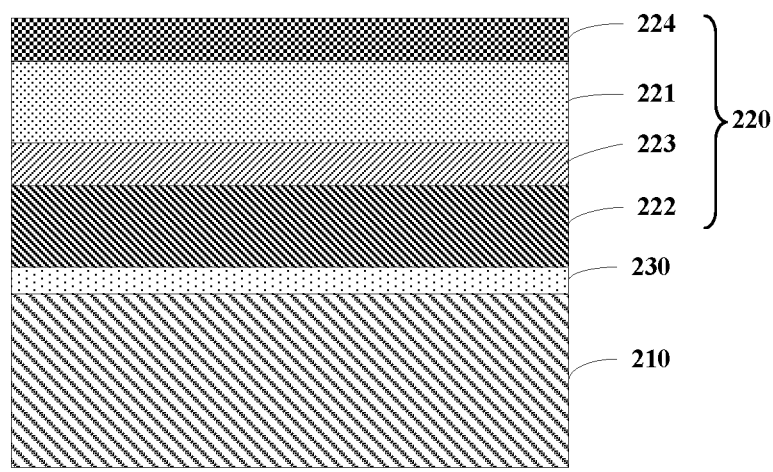
FIG. 2A to FIG. 2C are cross-sectional diagrams that schematically illustrate a structure at a plurality of phases of a manufacturing process of a semiconductor device.
Figure 2B:
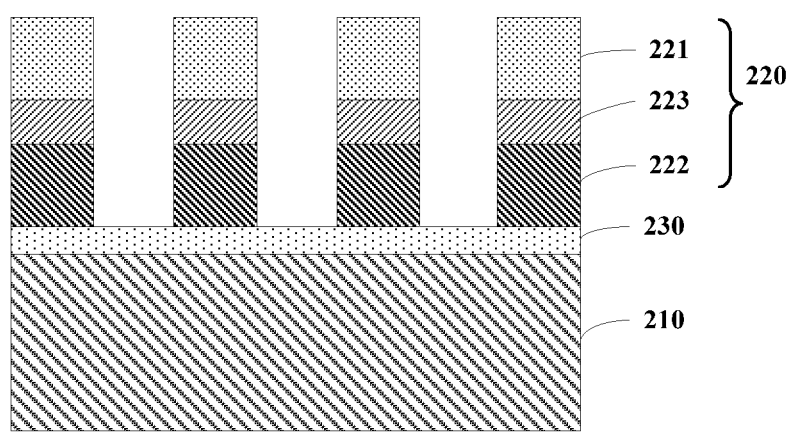
Figure 2C:
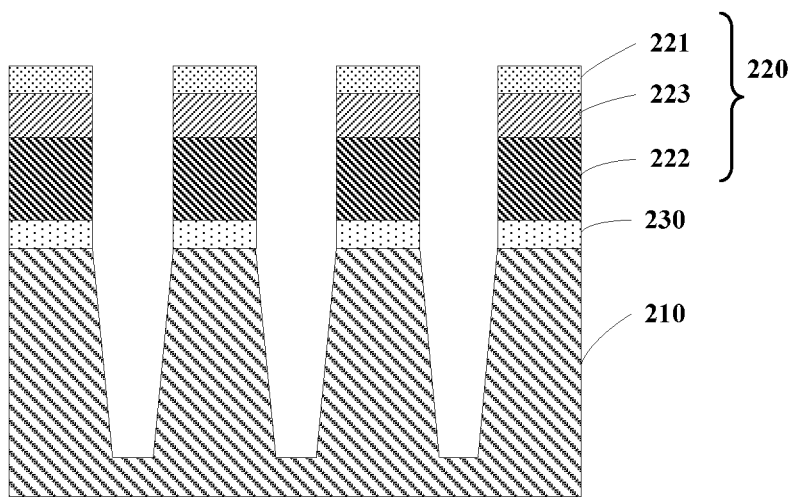

FIG. 1 is a flowchart of a manufacturing method of a semiconductor device. FIG. 2A to FIG. 2C are cross-sectional diagrams that schematically illustrate a structure at a plurality of phases of a manufacturing process of a semiconductor device. The following describes in detail a manufacturing process of a semiconductor device with reference to FIG. 1 and FIG. 2A to FIG. 2C.

As shown in FIG. 1, at step S101, an initial structure is provided. The initial structure includes a to-be-etched material layer and a mask structure located on the to-be-etched material layer. The mask structure includes a hydrophilic first mask layer.

FIG. 2A is a cross-sectional diagram schematically illustrates a structure at step S101. As shown in FIG. 2A, an initial structure is provided. The initial structure may include a to-be-etched material layer 210 and a mask structure 220 located on the to-be-etched material layer 210. The mask structure 220 may include a hydrophilic first mask layer 221. For example, a material for the first mask layer 221 may include a silicon dioxide. Certainly, the material for the first mask layer may also be another hydrophilic material.

In some forms, the to-be-etched material layer 210 may be a substrate (for example, a silicon substrate), and may also be another material layer that needs to be etched (for example, a silicon oxide layer, which may be formed by a deposition process).

In some forms, as shown in FIG. 2A, the initial structure may further include a buffer layer 230 located between the to-be-etched material layer 210 and the mask structure 220. For example, the buffer layer may be a silicon dioxide.

In some forms, the mask structure 220 may further include a hard mask layer on the buffer layer 230, where the first mask layer 221 is located on the hard mask layer. The hard mask layer, for example, may include a polysilicon layer and/or a silicon nitride layer. For example, as shown in FIG. 2A, the hard mask layer may include: a polysilicon layer 222 located on the buffer layer 230, and a silicon nitride layer 223 located on the polysilicon layer 222. In some forms, as shown in FIG. 2A, the mask structure 220 may further include a second mask layer 224 on the first mask layer 221. For example, a material for the second mask layer may include a photoresist.

In some forms, the step S101 may include providing a to-be-etched material layer 210. Optionally, the step S101 may further include: forming a buffer layer 230 on the to-be-etched material layer 210 by using a deposition or an oxidation process. Optionally, the step S101 may further include: successively forming a polysilicon layer 222, a silicon nitride layer 223, and a first mask layer 221 by using a deposition process. Optionally, the step S101 may further include: forming a second mask layer 224 on the first mask layer 221 by using a coating process, so as to form the initial structure shown in FIG. 2A.

Back to FIG. 1, at step S102, the mask structure is patterned to form a patterned mask structure.

FIG. 2B is a cross-sectional diagram schematically illustrating a structure at step S102. As shown in FIG. 2B, for example, the mask structure 220 is patterned by using photolithography and etching processes to form a patterned mask structure.

In some other forms, the mask structure may also be patterned by using SADP (self-aligned double patterning, self-aligned double patterning) or SAQP (self-aligned quadruple patterning, self-aligned quadruple patterning).

Back to FIG. 1, at step S103, the to-be-etched material layer is etched using the patterned mask structure as a mask.

FIG. 2C is a cross-sectional diagram schematically illustrating a structure at step S103. As shown in FIG. 2C, the to-be-etched material layer 210 is etched using the patterned mask structure 220 as a mask. This etching step forms the to-be-etched material layer 210 into a linear structure.

In some forms, this etching step may remove a part of the first mask layer, but still keep a part of the first mask layer, as shown in FIG. 2C.

In some forms, in the step of etching the to-be-etched material layer, the buffer layer 230 is also etched, as shown in FIG. 2C.

Back to FIG. 1, at step S104, a hydrophobic processing is performed on the first mask layer.

For example, the first mask layer 221 in the structure shown in FIG. 2C is performed with the hydrophobic processing, so that the first mask layer 221 changes from being hydrophilic into being hydrophobic. This helps to prevent the first mask layer from being adhered or combined in a subsequent cleaning step, thereby ameliorating a phenomenon that a linear structure collapses.

In some forms, the hydrophobic processing may include a plasma processing or other processing manners.

With regard to using the plasma processing to implement the hydrophobic processing, in some forms, the gases used in the plasma processing may include He (helium) and an alkane gas (such as methane). Alternatively, the gases used in the plasma processing may include N2, H2, or Ar (argon).

In some forms, the alkane gas may include methane. Accordingly, He and methane may be used in the plasma processing. The plasma processing is performed for a processing time of 6 seconds to 5 minutes (for example, 10 seconds, 30 seconds, 1 minute, or 3 minutes) within a pressure range of 10-200 millitorr (for example, a pressure of 50 millitorr or 100 millitorr) and within a temperature range of 0-150° C. (for example, a temperature of 50° C. or 100° C.).

In some forms, the hydrophobic processing may be performed in a same chamber in which the to-be-etched material layer is etched.

Back to FIG. 1, at step S105, a cleaning processing is performed.

For example, after step S104, a cleaning processing (also be called WET processing) is performed to the structure shown in FIG. 2C. The cleaning processing may clean up byproducts produced in the etching process. The cleaning processing may be implemented by using some acid or alkaline liquids.

So far, a manufacturing method of a semiconductor device is provided. In this form, by performing the hydrophobic processing to the first mask layer, the first mask layer changes from being hydrophilic into being hydrophobic. In the subsequent cleaning processing, this facilitates decreasing tensile stress of a liquid (for example, being generated in a drying process) and prevents the first mask layer from being adhered or combined, so as to ameliorate collapsing of a linear structure. For example, the linear structure may be prevented from collapsing.

FIG. 3A to FIG. 3G are cross-sectional diagrams that schematically illustrate a structure at a plurality of phases of a manufacturing process of a semiconductor device. The following describes in detail a manufacturing process of a semiconductor device with reference to FIG. 3A to FIG. 3G.

Figure 3A:
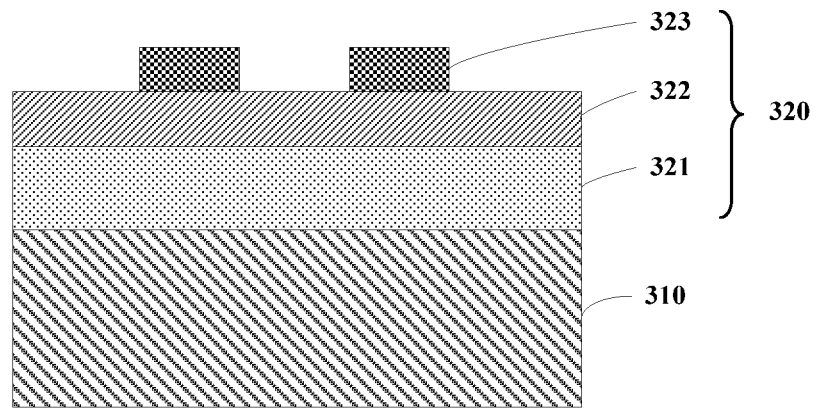
FIG. 3A to FIG. 3G are cross-sectional diagrams that schematically illustrate a structure at a plurality of phases of a manufacturing process of a semiconductor device.

First, as shown in FIG. 3A, an initial structure is provided. The initial structure may include: a to-be-etched material layer (for example, a silicon or an oxide of silicon) 310, and a mask structure 320 located on the to-be-etched material layer 310. The mask structure 320 may include a hydrophilic first mask layer 321. In some forms, the first mask layer 321 is on the to-be-etched material layer 310. In some forms, the mask structure 320 may further include: a bottom anti-reflective coating layer (BARC layer) 322 located on the first mask layer 321, and a patterned second mask layer (for example, a photoresist) 323 on the BARC layer 322.

Subsequently, the mask structure 320 is patterned to form a patterned mask structure.

Figure 3B:
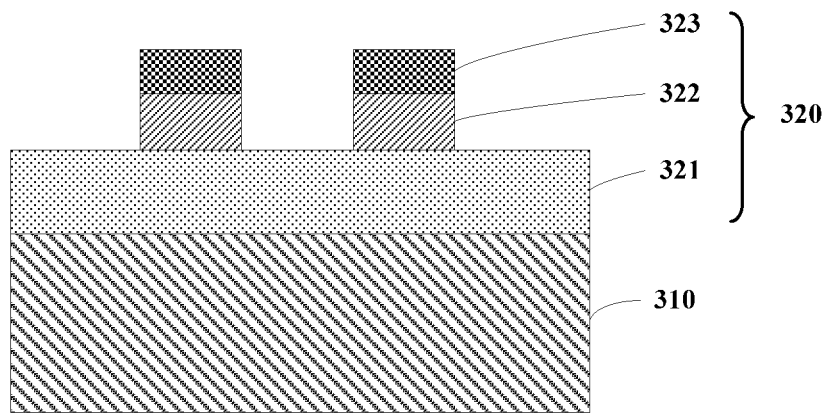

In some forms, the step of patterning the mask structure 320 may include: as shown in FIG. 3B, etching the BARC layer 322 by using the patterned second mask layer 323 as a mask, so as to form a patterned BARC layer 322.

Figure 3C:
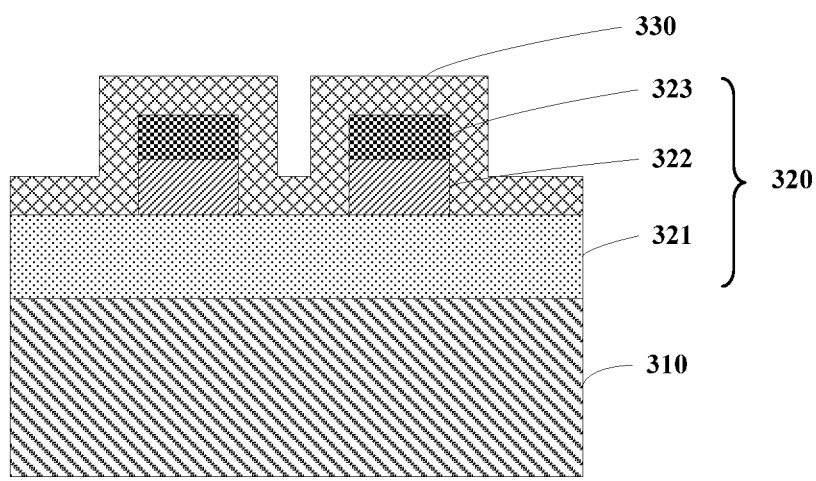

Subsequently and optionally, the step of patterning the mask structure 320 may further include: as shown in FIG. 3C, depositing a third mask layer (for example, a silicon dioxide) 330 to cover the patterned second mask layer 323 and the patterned BARC layer 322.

Figure 3D:
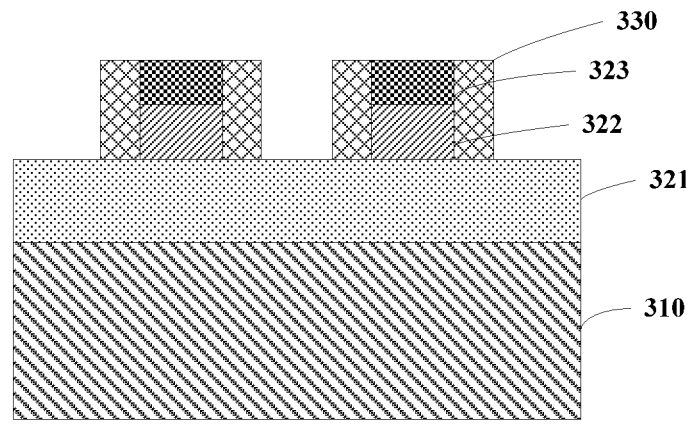
Figure 3E:
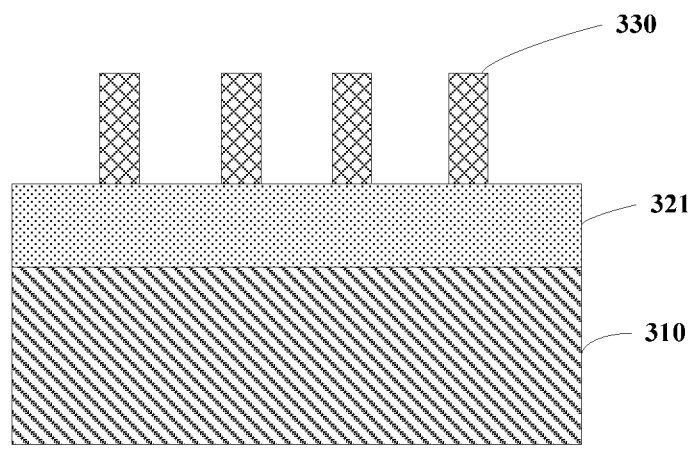

Subsequently and optionally, the step of patterning the mask structure 320 may further include: etching the third mask layer 330, and removing the second mask layer 323 and the BARC layer 322, so as to form a patterned third mask layer. For example, as shown in FIG. 3D, the third mask layer 330 is etched, so that a part of the third mask layer is removed and a part of the third mask layer that is at side surfaces of the second mask layer 323 and the BARC layer 322 is remained. Then, as shown in FIG. 3E, the second mask layer 323 and the BARC layer 322 are removed, so as to form a patterned third mask layer 330.

Figure 3F:
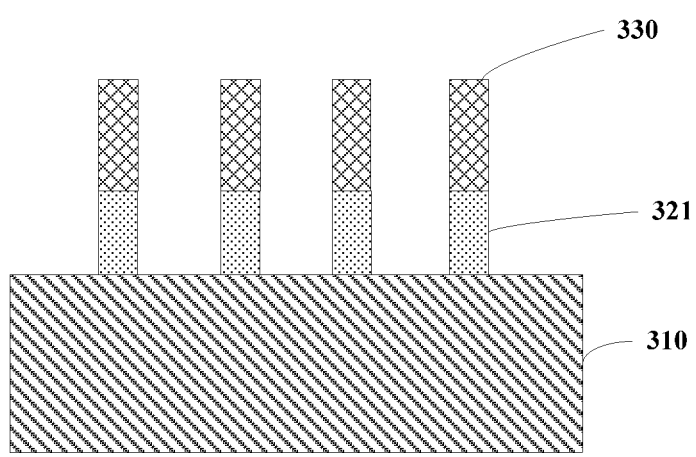

Subsequently and optionally, the step of patterning the mask structure 320 may further include: as shown in FIG. 3F, etching the first mask layer 321 by using the patterned third mask layer 330 as a mask, so as to form a patterned mask structure. This etching step forms the first mask layer into a patterned first mask layer.

Figure 3G:
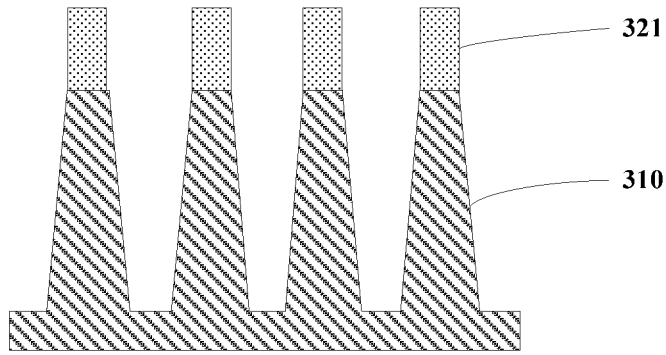

Subsequently, after the patterned mask structure is formed, as shown in FIG. 3G, the to-be-etched material layer 310 is etched by using the patterned mask structure as a mask, so as to form a linear structure. For example, the third mask layer 330 may be removed first, and then the to-be-etched material layer 310 is etched by using the patterned first mask layer 321 as a mask.

Subsequently, a hydrophobic processing is performed to the first mask layer 321, thereby enabling the first mask layer 321 to change from being hydrophilic into being hydrophobic. This hydrophobic processing is similar to the hydrophobic processing described above, and details are not described herein again.

Subsequently, after the hydrophobic processing is performed, a washing processing is performed to the structure shown in FIG. 3G.

In this form, a linear structure having a high aspect ratio may be formed. Through the hydrophobic processing, collapse of a linear structure may be well prevented from occurring.

FIG. 4A to FIG. 4J are cross-sectional diagrams that schematically illustrate a structure at a plurality of phases of a manufacturing process of a semiconductor device. The following describes in detail a manufacturing process of a semiconductor device with reference to FIG. 4A to FIG. 4J.

Figure 4A:
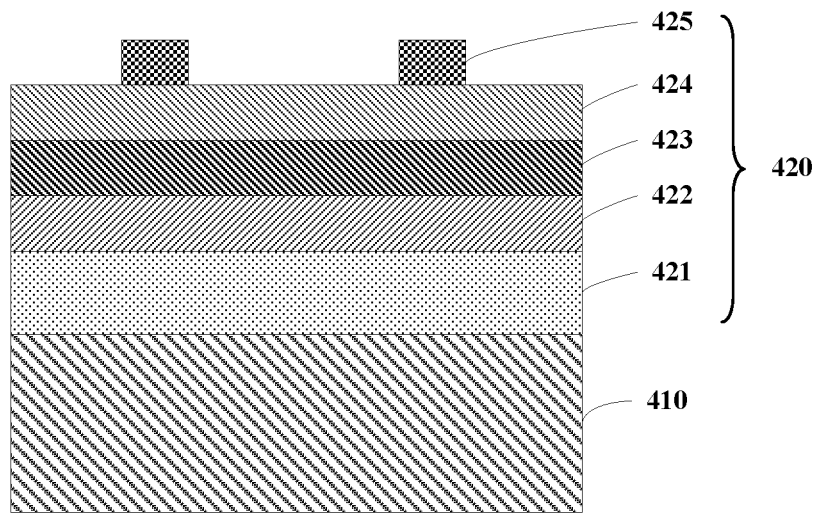
FIG. 4A to FIG. 4J are cross-sectional diagrams that schematically illustrate a structure at a plurality of phases of a manufacturing process of a semiconductor device.

First, as shown in FIG. 4A, an initial structure is provided. The initial structure may include: a to-be-etched material layer (for example, a silicon or an oxide of silicon) 410, and a mask structure 420 located on the to-be-etched material layer 410. The mask structure 420 may include a hydrophilic first mask layer 421. In some forms, the first mask layer 421 is on the to-be-etched material layer 410. In some forms, the mask structure 420 may further include: a first hard mask layer 422 located on the first mask layer 421, a second hard mask layer 423 located on the first hard mask layer 422, a BARC layer 424 located on the second hard mask layer 423, and a patterned second mask layer (for example, a photoresist) 425 on the BARC layer 424.

Subsequently, the mask structure 420 is patterned to form a patterned mask structure.

Figure 4B:
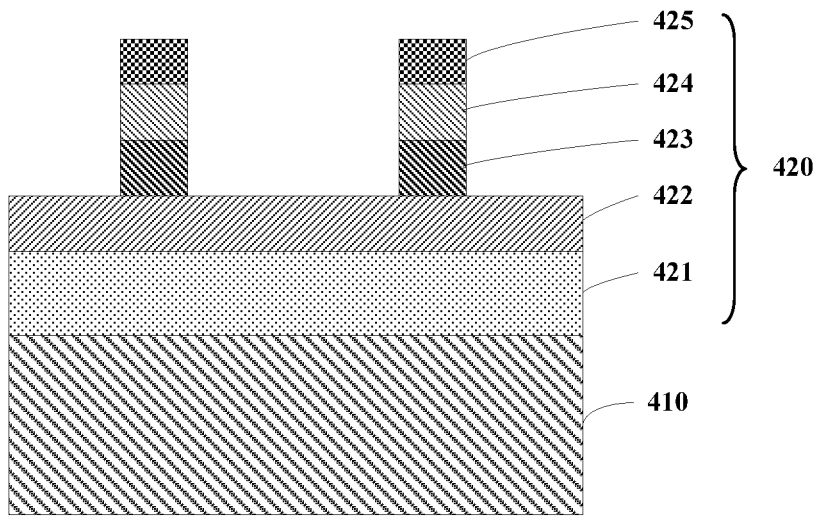

In some forms, the step of patterning the mask structure 420 may include: as shown in FIG. 4B, etching the BARC layer 424 and the second hard mask layer 423 by using the patterned second mask layer 425 as a mask, so as to form a patterned BARC layer and a patterned second hard mask layer.

Subsequently and optionally, the step of patterning the mask structure 420 may further include: removing the BARC layer 424 and the second mask layer 425.

Figure 4C:
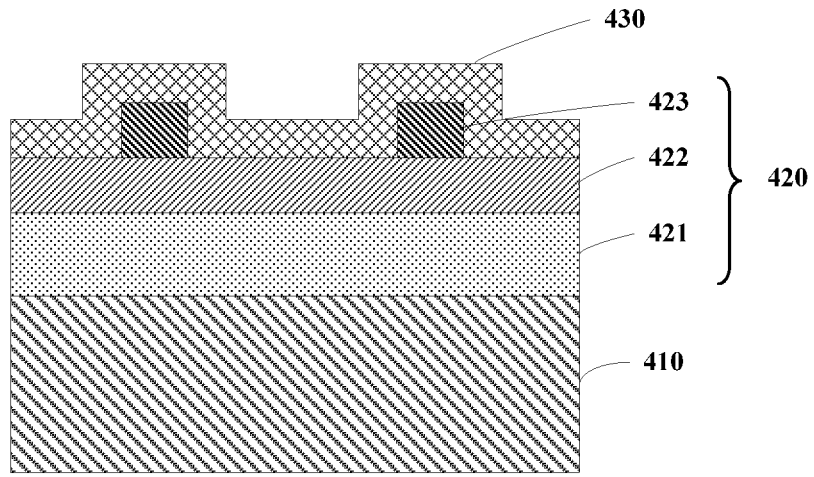

Subsequently and optionally, the step of patterning the mask structure 420 may further include: as shown in FIG. 4C, depositing a third mask layer (for example, a silicon dioxide) 430 to cover the patterned second hard mask layer 423.

Figure 4D:
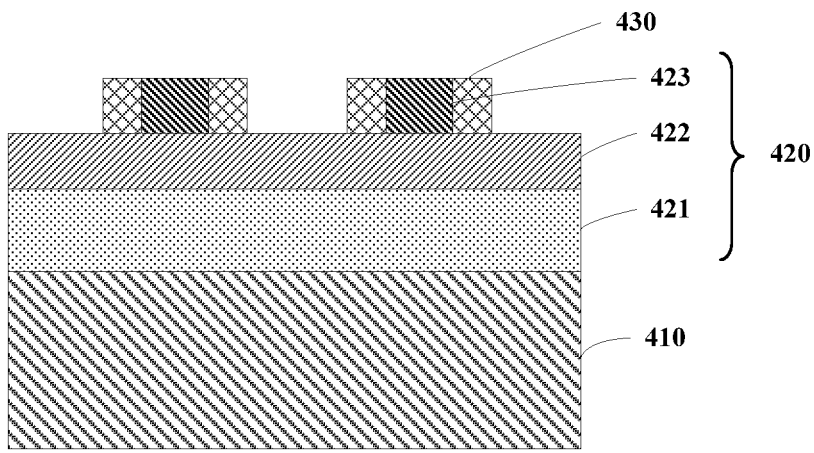
Figure 4E:
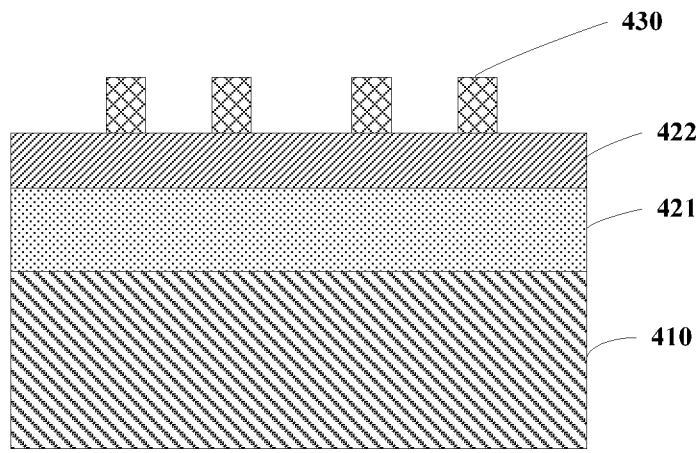

Subsequently and optionally, the step of patterning the mask structure 420 may further include: etching the third mask layer 430 and removing the second hard mask layer 423, so as to form a patterned third mask layer. For example, as shown in FIG. 4D, the third mask layer 430 is etched, so that a part of the third mask layer is removed and a part of the third mask layer that is at a side surface of the second hard mask layer 423 is remained. Then, as shown in FIG. 4E, the second hard mask layer 423 is removed, so as to form a patterned third mask layer 430.

Figure 4F:
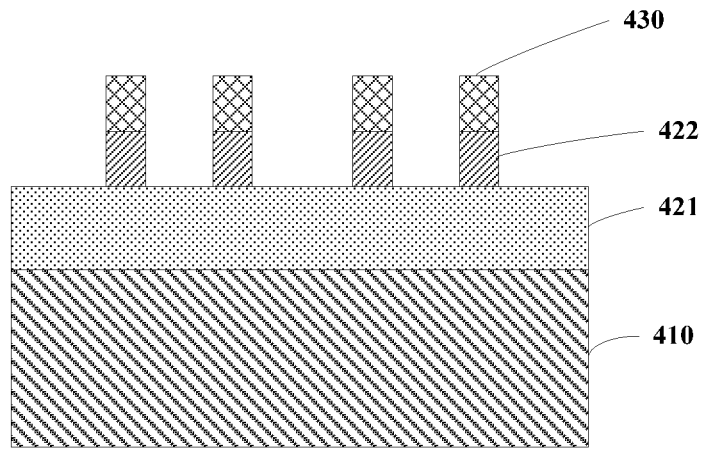

Subsequently and optionally, the step of patterning the mask structure 420 may further include: as shown in FIG. 4F, etching the first hard mask layer 422 by using the patterned third mask layer 430 as a mask, so as to form a patterned first hard mask layer.

Subsequently and optionally, the step of patterning the mask structure 420 may further include: removing the third mask layer 430.

Figure 4G:
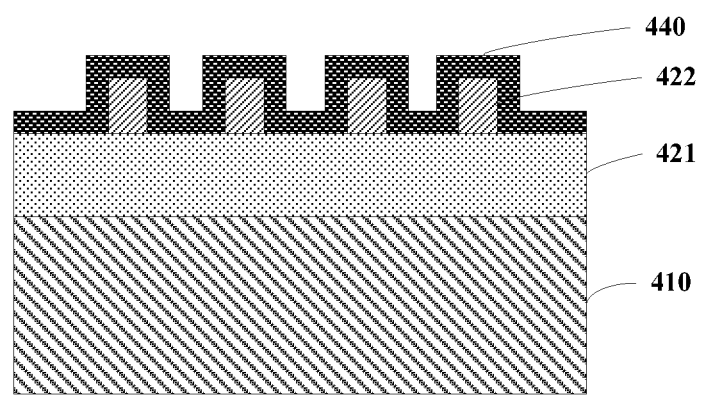

Subsequently and optionally, the step of patterning the mask structure 420 may further include: as shown in FIG. 4G, depositing a fourth mask layer (for example, a silicon dioxide) 440 to cover the patterned first hard mask layer 422.

Figure 4H:
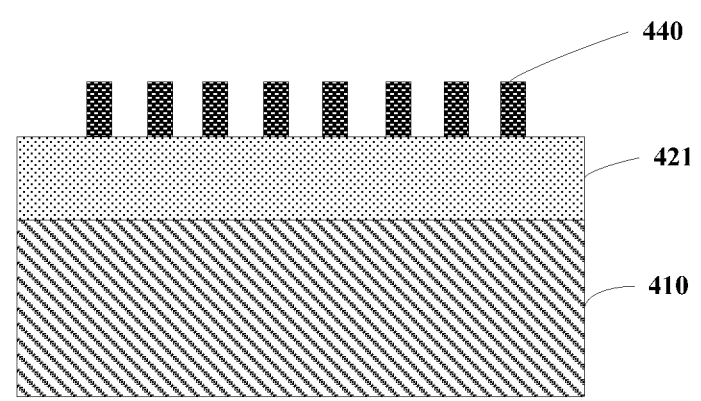

Subsequently and optionally, the step of patterning the mask structure 420 may further include: as shown in FIG. 4H, etching the fourth mask layer 440 and removing the first hard mask layer 422 to form a patterned fourth mask layer.

Figure 4I:
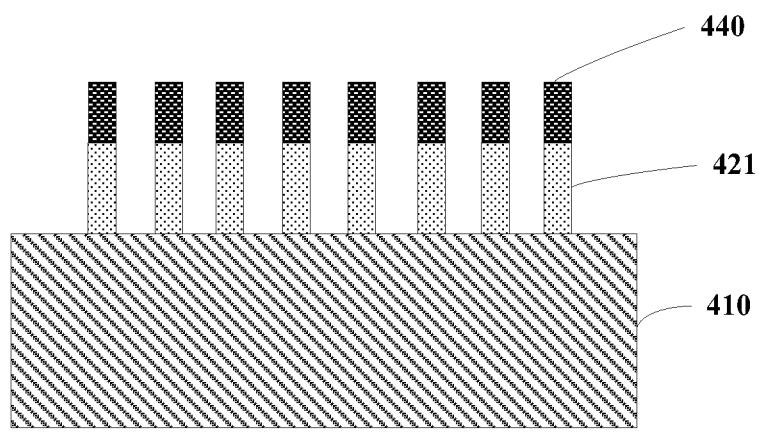

Subsequently, optionally, the step of patterning the mask structure 420 may further include: as shown in FIG. 4I, etching the first mask layer 421 by using the patterned fourth mask layer 440 as a mask, so as to form a patterned mask structure. This etching step forms the first mask layer into a patterned first mask layer.

Figure 4J:
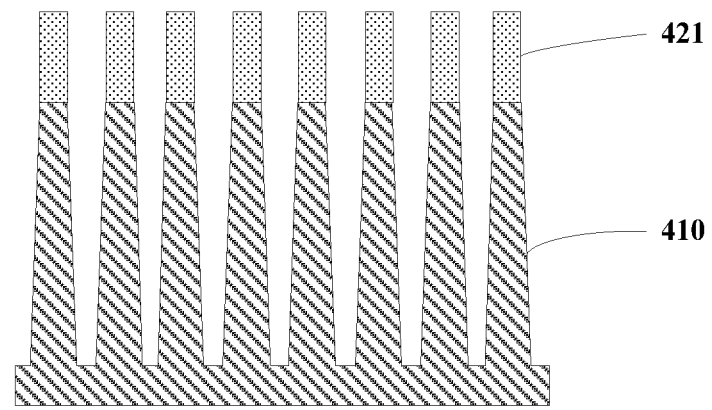

Subsequently, after the patterned mask structure is formed, as shown in FIG. 4J, the to-be-etched material layer 410 is etched by using the patterned mask structure as a mask, so as to form a linear structure. For example, the fourth mask layer 440 may be removed first, and then the to-be-etched material layer 410 is etched by using the patterned first mask layer 421 as a mask.

Subsequently, a hydrophobic processing is performed to the first mask layer 421, thereby enabling the first mask layer 421 to change from being hydrophilic into being hydrophobic. This hydrophobic processing is similar to the hydrophobic processing described above, and details are not described herein again.

Subsequently, after the hydrophobic processing is performed, a washing processing is performed to the structure shown in FIG. 4J.

In this form above, a linear structure having a higher aspect ratio may be formed. Through the hydrophobic processing, collapses of a linear structure may be well prevented.

Above, the present disclosure is described in detail. To avoid obscuring the idea of the present disclosure, some details generally known in the art are not described. According to the foregoing description, a person of ordinary skill in the art will appreciate how to implement the technical solutions disclosed herein.

Some specific forms of the present disclosure are described in detail through examples. However, a person skilled in the art should understand that the foregoing examples are merely for description, but are not intended to limit the scope of the present disclosure. A person skilled in the art should understand that the foregoing forms may be modified without departing from the scope and spirit of the present disclosure. The scope of the present disclosure is defined by the appended claims.

What is claimed is:

1. A manufacturing method of a semiconductor device, comprising:

providing an initial structure, wherein the initial structure comprises a to-be-etched material layer and a mask structure located on the to-be-etched material layer, and wherein the mask structure comprises a hydrophilic first mask layer on the to-be-etched material layer, a first hard mask layer located on the first mask layer, a second hard mask layer located on the first hard mask layer, a bottom anti-reflective coating layer ("BARC layer") located on the second hard mask layer, and a patterned second mask layer located on the BARC layer;

etching the BARC layer and the second hard mask layer using the patterned second mask layer as a mask, so as to form a patterned BARC layer and a patterned second hard mask layer;

removing the BARC layer and the second mask layer;

depositing a third mask layer to cover the patterned second hard mask layer;

etching the third mask layer and removing the second hard mask layer to form a patterned third mask layer;

etching the first hard mask layer using the patterned third mask layer as a mask, so as to form a patterned first hard mask layer;

removing the third mask layer;

depositing a fourth mask layer to cover the patterned first hard mask layer;

etching the fourth mask layer and removing the first hard mask layer to form a patterned fourth mask layer;

etching the first mask layer by using the patterned fourth mask layer as a mask to form a patterned mask structure;

etching the to-be-etched material layer using the patterned mask structure as a mask;

performing a hydrophobic processing on the first mask layer; and performing a cleaning processing.

2. The method according to claim 1, wherein:

a material for the first mask layer comprises a silicon dioxide.

3. The method according to claim 1, wherein:

the initial structure further comprises a buffer layer located between the to-be-etched material layer and the mask structure; and in the step of etching the to-be-etched material layer, the buffer layer is also etched.

4. The method according to claim 3, wherein:

the mask structure further comprises a hard mask layer on the buffer layer, wherein the first mask layer is located on the hard mask layer; and the mask structure further comprises a second mask layer located on the first mask layer.

5. The method according to claim 4, wherein the hard mask layer comprises at least one of a polysilicon layer or a silicon nitride layer.

6. The method according to claim 1, wherein the mask structure is patterned using photolithography and an etching processes.

7. The method according to claim 1, wherein:

the first mask layer is on the to-be-etched material layer; and the mask structure further comprises:

a bottom anti-reflective coating layer ("BARC layer") on the first mask layer, and a patterned second mask layer on the BARC layer.

8. The method according to claim 7, wherein the step of patterning the mask structure comprises:

etching the BARC layer using the patterned second mask layer as a mask, so as to form a patterned BARC layer;

depositing a third mask layer to cover the patterned second mask layer and the patterned BARC layer;

etching the third mask layer, and removing the second mask layer and the BARC layer, so as to form a patterned third mask layer; and etching the first mask layer by using the patterned third mask layer as a mask, so as to form the patterned mask structure.

9. The method according to claim 1, wherein:

the hydrophobic processing comprises a plasma processing, and gases used in the plasma processing comprise He and an alkane gas, or comprise N2, H2, or Ar.

10. The method according to claim 9, wherein: the alkane gas comprises methane; and He and methane are used as the gases used in the plasma processing, and the plasma processing is performed for a processing time of 6 seconds to 5 minutes within a pressure range of 10 millitorr to 200 millitorr and within a temperature range of 0QC to 150 C.

* * * * *